United States Patent [19]
Nakajima et al.

[11] Patent Number: 6,114,917
[45] Date of Patent: Sep. 5, 2000

[54] ANALOG PLL CIRCUIT AND METHOD OF CONTROLLING THE OSCILLATION OF A VOLTAGE CONTROLLED OSCILLATOR

[75] Inventors: Shoj Nakajima, Tokyo; Tamami Hatanaka, Kawasaki; Moriyuki Tashiro, Tokyo; Minoru Kiumi, Yokohama; Hirohisa Hirano, Kawasaki, all of Japan

[73] Assignee: Kabushiki Kaisha Toshiba, Kawasaki, Japan

[21] Appl. No.: 09/181,617

[22] Filed: Oct. 28, 1998

[30] Foreign Application Priority Data

Oct. 29, 1997  [JP]  Japan .................................. 9-297339

[51] Int. Cl.[7] ................ H03B 5/00; H03L 7/09
[52] U.S. Cl. .............. 331/57; 331/1 A; 331/34; 331/74; 327/263; 327/264; 327/158; 327/159
[58] Field of Search .................. 331/57, 1 A, 34, 331/74; 327/263, 264, 158, 159

[56] References Cited

U.S. PATENT DOCUMENTS 5,257,294  10/1993  Pinto et al. ............................. 331/1 A

FOREIGN PATENT DOCUMENTS 7-106962  4/1995  Japan .

*Primary Examiner*—Arnold Kinkead
*Attorney, Agent, or Firm*—Oblon, Spivak, McClelland, Maier & Neustadt, P.C.

[57] ABSTRACT

The present invention provides an analog PLL circuit able to shorten a lockin time during which oscillating frequency and phase of a voltage controlling oscillator settle.

An analog PLL circuit according to the present invention comprises a divider, a phase comparator, a charge pump, a low pass filter, a voltage controlling oscillator, and a divider. The voltage controlling oscillator has a ring oscillator composed of a plurality of logic inverting elements capable of changing the delay amount. During the reset period, the initial voltage is inputted to the voltage controlling oscillator via the analog switch, and the initial delay amount is set to each of the logic inverting elements. After the reset period finishes, at the point when the rising edge of the standard input signal is firstly inputted, the output of the D flip-flop becomes high level and the ring oscillator begins the oscillating operation.

15 Claims, 8 Drawing Sheets

ANALOG PLL CIRCUIT AND METHOD OF CONTROLLING THE OSCILLATION OF A VOLTAGE CONTROLLED OSCILLATOR

BACKGROUND OF THE INVENTION

1. Field of Invention

The present invention relates to an analog PLL circuit performing feedback control so that a phase of an oscillating output of a voltage controlling oscillator coincides with one of a standard input signal. Especially, the present invention relates to a technique that allows a lock-in time of the analog PLL circuit to shorten.

2. Related Background Art

FIG. 8 is a block diagram of a conventional analog PLL circuit. The analog PLL circuit of FIG. 8 comprises a divider 1, a phase comparator 2, a charge pump 3, a low pass filter 4, a voltage controlling oscillator 5, and a divider 6.

The divider 1 divides a standard input signal fin into M (M is an integer more than or equal to 2). The divider 6 divides the output of the voltage controlling oscillator 5 into N (N is an integer more than or equal to 2). The phase comparator 2 outputs a signal corresponding to deviation of the frequency and the phase of each output of the dividers 1 and 6. More specifically, in case the rising time of the output of the divider 1 is slower than the rising time of the output of the divider 6, the phase comparator 2 supplies an UP signal corresponding to the phase difference to the charge pump 3. Reversely, in case the rising time of the output of the divider 6 is slower than the rising time of the output of the divider 1, the phase comparator 2 supplies the DOWN signal corresponding to the phase difference to the charge pump 3.

In case the UP signal is supplied from the phase comparator 2, the charge pump 3 sets the input level of the low pass filter 4 to high level by means of performing charge. Reversely, in case the DOWN signal is supplied from the phase comparator 2, the charge pump 3 sets the input level of the low pass filter 4 to low level by means of performing discharge.

The low pass filter 4 eliminates unnecessary high frequency component included to the signal output from the charge pump. The output of the low pass filter 4 is supplied to the voltage controlling oscillator 5. The voltage controlling oscillator 5 outputs a signal with frequency corresponding to the voltage outputted from the low pass filter 4. The output fout of the voltage controlling oscillator 5 is used as an ultimate output and is inputted to the phase comparator 2 after being inputted to the divider 6 and divided by the divider 6.

As above mentioned, because the conventional analog PLL circuit inputs the signal dividing the output of the voltage controlling oscillator 5 and the signal dividing the standard input signal fin to the phase comparator 2, and performs the feedback control so that the frequency and the phase of the signals coincide, respectively, it is possible to output the oscillating signal with the coherent frequency and phase from the voltage controlling oscillator 5.

However, the conventional analog PLL circuit has a problem in that the output of the low pass filter may be inconstant just after a reset period finishes. That is, because the conventional analog PLL circuit resets only the divider 1 and 6, the phase comparator 2 and the voltage controlling oscillator 5, and did not reset the low pass filter 4, the output of the low pass filter 4 may be inconstant. The time necessary to settle the output frequency and the phase of the voltage controlling oscillator 5 (the time is called "lockin time" as follows) may become long.

Further, the oscillation frequency of the voltage controlling oscillator 5 may change due to the power supply voltage, the surrounding temperature, the manufacturing process, and so on. For example, FIG. 4 is a diagram showing the frequency property of the voltage controlling oscillator 5. In FIG. 4, the horizontal axis is the input voltage, and the vertical axis is the output frequency. The frequency property of the voltage controlling oscillator 5 changes due to the power supply voltage, the surrounding temperature, manufacturing process and so on. Assumed that a curb line A in FIG. 4 is an imaginary curb line, due to various dispersion, the frequency property changes like a curb line B or a curb line C. Accordingly, for example, even if the voltage V1 shown in FIG. 4 is inputted to the voltage controlling oscillator 5, due to various dispersion, the output frequency changes in a range of from f0 through f2.

SUMMARY OF THE INVENTION

An object of the present invention is to provide an analog PLL circuit and method controlling oscillation of voltage controlling oscillator being able to shorten the lockin time during which the oscillating frequency and the phase of the voltage controlling oscillator settles and being able to output the high-precision signal with the coherent frequency and phase.

In order to achieve the foregoing object, an analog switch, comprising:

a voltage controlling oscillator capable of changing a frequency in accordance with voltage;

a first divider for dividing an output of said voltage controlling oscillator;

a second divider for dividing a standard input signal;

a phase comparator for outputting a signal corresponding to frequency deviation and phase deviation of said first and second dividers;

a charge pump for outputting voltage corresponding to amount and direction of the phase deviation based on the output of said phase comparator;

a low pass filter for eliminating high-frequency component included to the output voltage of said charge pump;

a ring oscillator for being provided inside said voltage controlling oscillator and having a delay circuit capable of changing a delay amount, an oscillating frequency of said ring oscillator being controlled variably based on said delay amount;

a delay amount control section for being provided inside said voltage controlling oscillator and setting the delay amount of said delay circuit;

an initial delay amount setting circuit for setting an initial delay amount of said delay circuit by means of said delay amount control section during reset period; and an oscillation controlling circuit for allowing oscillating operation of said ring oscillator to begin at the point when rising edge or falling edge of said standard input signal is firstly inputted after the reset period finishes, wherein:

the oscillating frequency of said voltage controlling oscillator is controlled in accordance with the output of said low pass filter.

According to the present invention, because the initial delay amount of each delay circuit constituting a ring oscillator inside a voltage controlling oscillator is set during the reset period, and the oscillating operation of the ring oscillator is begun at the point a rising edge or a falling edge is inputted, it is possible to shorten the lockin time during which the frequency and phase of the voltage controlling oscillator settles. That is, if the delay amount corresponding to a desirable oscillating frequency is set to each delay circuit in advance during the reset period, the frequency and the phase change while centering the desirable oscillating frequency. Therefore, it is possible to obtain a desirable oscillating frequency in short time. Because the oscillating operation of the ring oscillator is begun, after the reset period finishes, at the point the edge of the standard input signal is inputted, the output level of the ring oscillator becomes stable, and it is possible to allow the oscillating operation to settle.

Further, in order to achieve the foregoing object, an analog PLL circuit for having a voltage controlling oscillator capable of changing frequency in accordance with voltage, a first divider for dividing an output of said voltage controlling oscillator, a second divider for dividing a standard input signal, a phase comparator for outputting a signal corresponding to frequency deviation and phase deviation of said first and second dividers, a charge pump for outputting voltage corresponding to amount and direction of the phase deviation based on the output of said phase comparator, and a low pass filter for eliminating high-frequency component included to the output voltage of said charge pump, comprising:

a ring oscillator for being provided inside said voltage controlling oscillator and having uneven pieces of logic inverting elements capable of changing a delay amount, the output of the last stage of said logic inverting elements being fed back to the input of the first stage of said logic inverting elements, and an oscillating frequency of said ring oscillator being controlled variably in accordance with the delay amount;

a delay amount control section for being provided inside said voltage controlling oscillator and setting the delay amount of said delay circuit;

an initial delay amount setting circuit for setting an initial delay amount of said delay circuit by means of said delay amount control section during reset period; and an oscillation controlling circuit for allowing oscillating operation of said ring oscillator to begin at the point when rising edge or falling edge of said standard input signal is firstly inputted after the reset period finishes.

Further, in order to achieve the foregoing object, an analog PLL circuit for having a voltage controlling oscillator capable of changing frequency in accordance with voltage, a first divider for dividing an output of said voltage controlling oscillator, a second divider for dividing a standard input signal, a phase comparator for outputting a signal corresponding to frequency deviation and phase deviation of said first and second dividers, a charge pump for outputting voltage corresponding to amount and direction of the phase deviation based on the output of said phase comparator, and a low pass filter for eliminating high-frequency component included to the output voltage of said charge pump, comprising:

a ring oscillator for being provided inside said voltage controlling oscillator and having uneven pieces of logic inverting elements connected in series and delay circuits connected between each stage of said logic inverting elements capable of changing a delay amount, an oscillating frequency of said ring oscillator being controlled variably in accordance with the delay amount;

a delay amount control section for being provided inside said voltage controlling oscillator and setting the delay amount of said delay circuit;

an initial delay amount setting circuit for setting an initial delay amount of said delay circuit by means of said delay amount control section during reset period; and an oscillation controlling circuit for allowing oscillating operation of said ring oscillator to begin at the point when rising edge or falling edge of said standard input signal is firstly inputted after the reset period finishes.

DESCRIPTION OF THE PREFERRED EMBODIMENTS

An analog PLL circuit according to the present invention is described in detail with reference to the attached drawings.

First Embodiment

Figure 1:
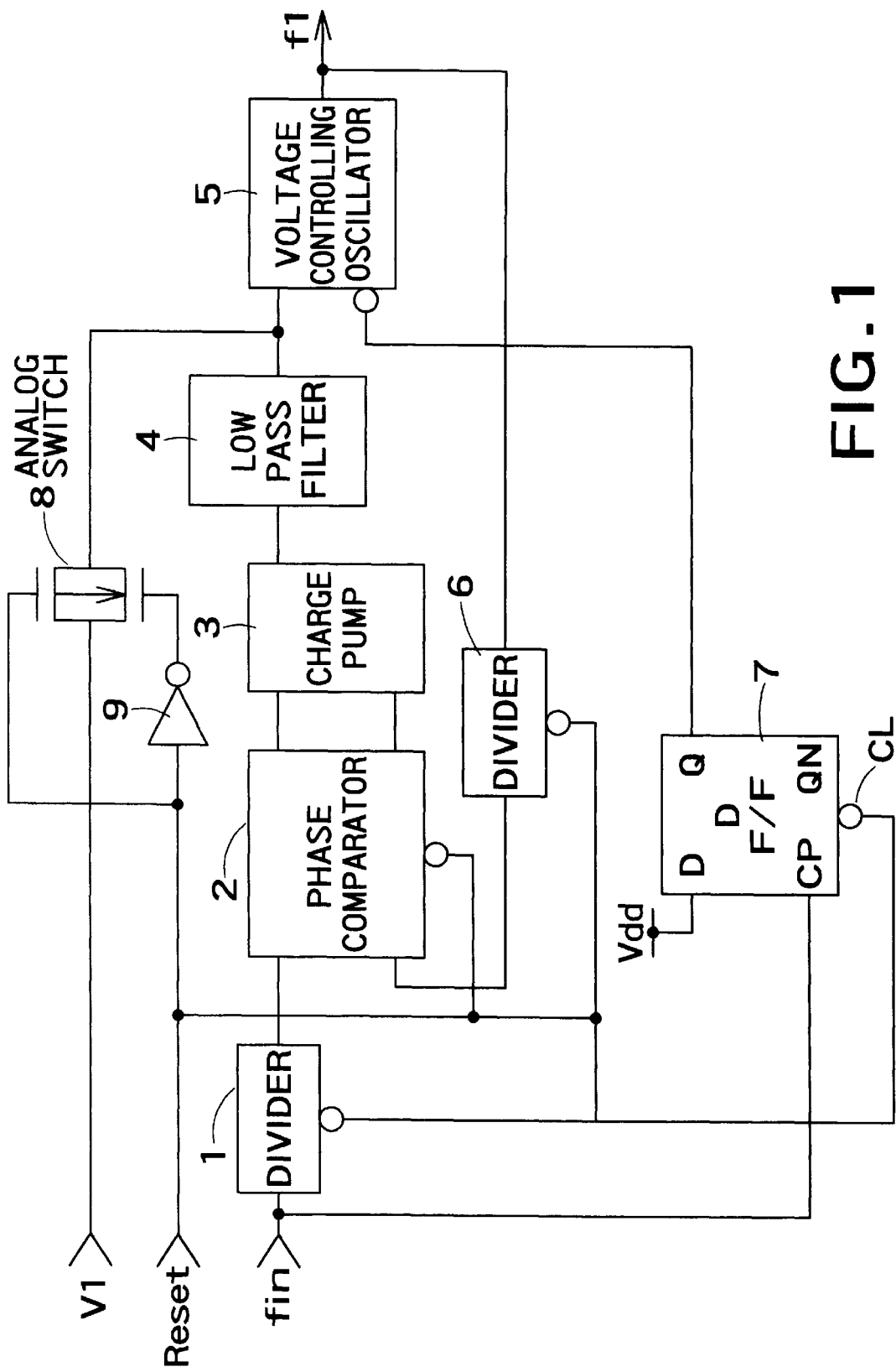
FIG. 1 is a circuit diagram of a first embodiment of an analog PLL circuit according to the present invention.

FIG. 1 is a circuit diagram of a first embodiment of an analog PLL circuit according to the present invention. The circuit of FIG. 1 is formed on a semiconductor substrate. In FIG. 1, the same symbols are attached to the same constituent as one of FIG. 8.

Figure 8:
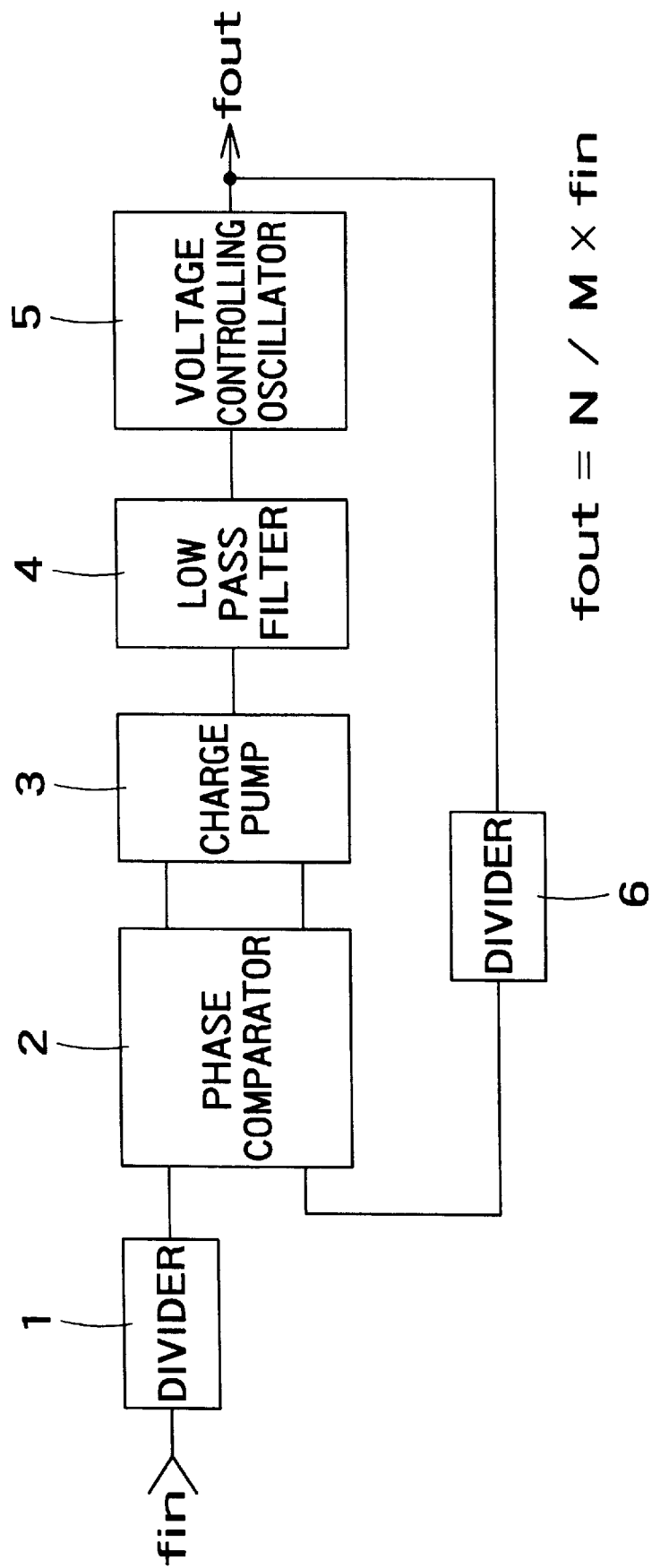
FIG. 8 is a block diagram of a conventional analog switch.

The analog PLL circuit of FIG. 1, similar to the circuit of FIG. 8, comprises the divider 1, the phase comparator 2, the charge pump 3, the low pass filter 4, the voltage controlling oscillator 5, and the divider 6. The circuit of FIG. 1 comprises a D flip-flop 7, an analog switch 8, and an inverter 9 as new constituents.

The reset signal is inputted to the dividers 1 and 6, the phase comparator 2, the voltage controlling oscillator 5, the D flip-flop 7 in FIG. 1. During the reset period, that is, when the reset signal is low level, the dividers 1 and 6, the phase comparator 2, the voltage controlling oscillator 5, and the D flip-flop 7 is reseted.

The divider 1 outputs a signal with the frequency of a Mth part of the standard input signal, and the divider 6 outputs a signal with the frequency of a Nth part of the standard input signal. The phase comparator 2 compares the frequency of the outputs of the divider 1 with one of the divider 6, compares the phase of the output of the divider 1 with one of the divider 6, and outputs an UP signal and a DOWN signal corresponding to deviation of the frequency and the phase. The charge pump 3 performs charge and discharge in accordance with the UP signal and the DOWN signal in order to adjust the input level of the low pass filter 4. The low pass filter 4 eliminates unnecessary high-frequency component included to the signal outputted from the charge pump 3. The output of the low pass filter 4 is inputted to the voltage controlling oscillator 5.

The standard input signal fin is inputted to a clock terminal of the D flip-flop 7. The Q output terminal of the D flip-flop 7 is connected to the voltage controlling oscillator 5. At the point when the Q output of the D flip-flop 7 becomes high level, that is, at the point the rising edge of the standard input signal fin is firstly inputted after the reset period finishes, the voltage controlling oscillator 5 begins the oscillating operation.

The analog switch 8 changes in accordance with the logic of the reset signal whether or not to supply an initial voltage V1 to the voltage controlling oscillator 5. More specifically, during the reset period, that is, when the reset signal is low level, the analog switch 8 turns on and the initial voltage V1 is supplied to the voltage controlling oscillator 5. On the other hand, after the reset period finishes, that is, when the reset signal is high level, the analog switch 8 turns off and the output of the low pass filter 4 is supplied to the voltage controlling oscillator 5.

Figure 2:
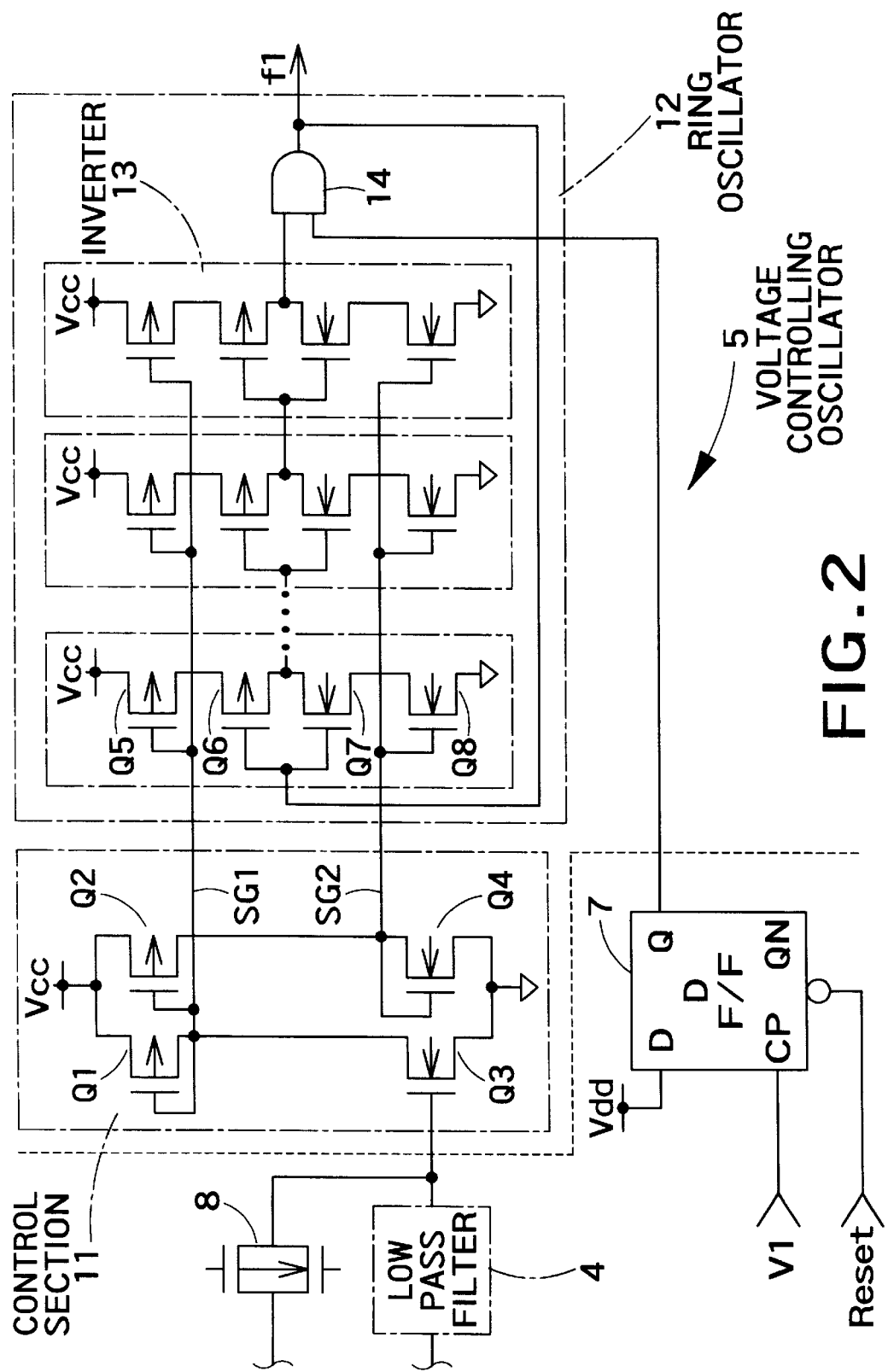
FIG. 2 is a circuit diagram showing an internal configuration of the voltage controlling oscillator.

FIG. 2 is a circuit diagram showing an internal configuration of the voltage controlling oscillator 5. Inside the voltage controlling oscillator 5, the controller 11 of a current mirror type that outputs the voltage corresponding to the input voltage, and a ring oscillator 12 composed of uneven pieces of inverters 9 that are connected in series and being capable of changing the delay amount.

The control section 11 comprises PMOS transistors Q1 and Q2, and NMOS transistors Q3 and Q4. The source terminals of the PMOS transistors Q1 and Q2 are connected to the power supply terminal Vcc, the drain terminals of the PMOS transistors Q1 and Q2 are connected to the drain terminals of the NMOS transistors Q3 and Q4, and the source terminals of the NMOS transistors Q3 and Q4 is grounded.

The ring inverters 12 comprises uneven pieces of inverters 13 connected in series and an AND gate 14 connected to the last stage of the inverters 13. The output of the AND gate 14 is fed backed to input side of the first stage of the inverters 13.

Each inverter 13 inside the ring oscillator 12 comprises PMOS transistors Q5 and Q6, and NMOS transistors Q7 and Q8. The transistors Q6 and Q7 in the inverter 13 perform the inverting operation being inherent purpose, and the transistors Q5 and Q8 adjust the delay amount.

The gate terminals of the PMOS transistor Q5 in each inverter 13 are connected commonly, and these gate terminals are controlled by the signal SG1 from the control section 11. In the same way, the gate terminals of the NMOS transistor Q8 are connected commonly, and these gate terminals are controlled by the signal SG2.

The output terminal of the last stage of the inveters 13 is connected to one input terminal of the AND gate 14, and the Q output terminal of the D flip-flop 7 is connected to the other input terminal of the AND gate 14. When the Q output of the D flip-flop 7 is low level, that is, during the reset period and a period from the point when the reset period finishes until the point when the rising edge of the standard input signal fin is firstly inputted, the output of the AND gate 14 becomes low level forcedly, and the ring oscillator 12 does not perform the oscillating operation.

Figure 3:
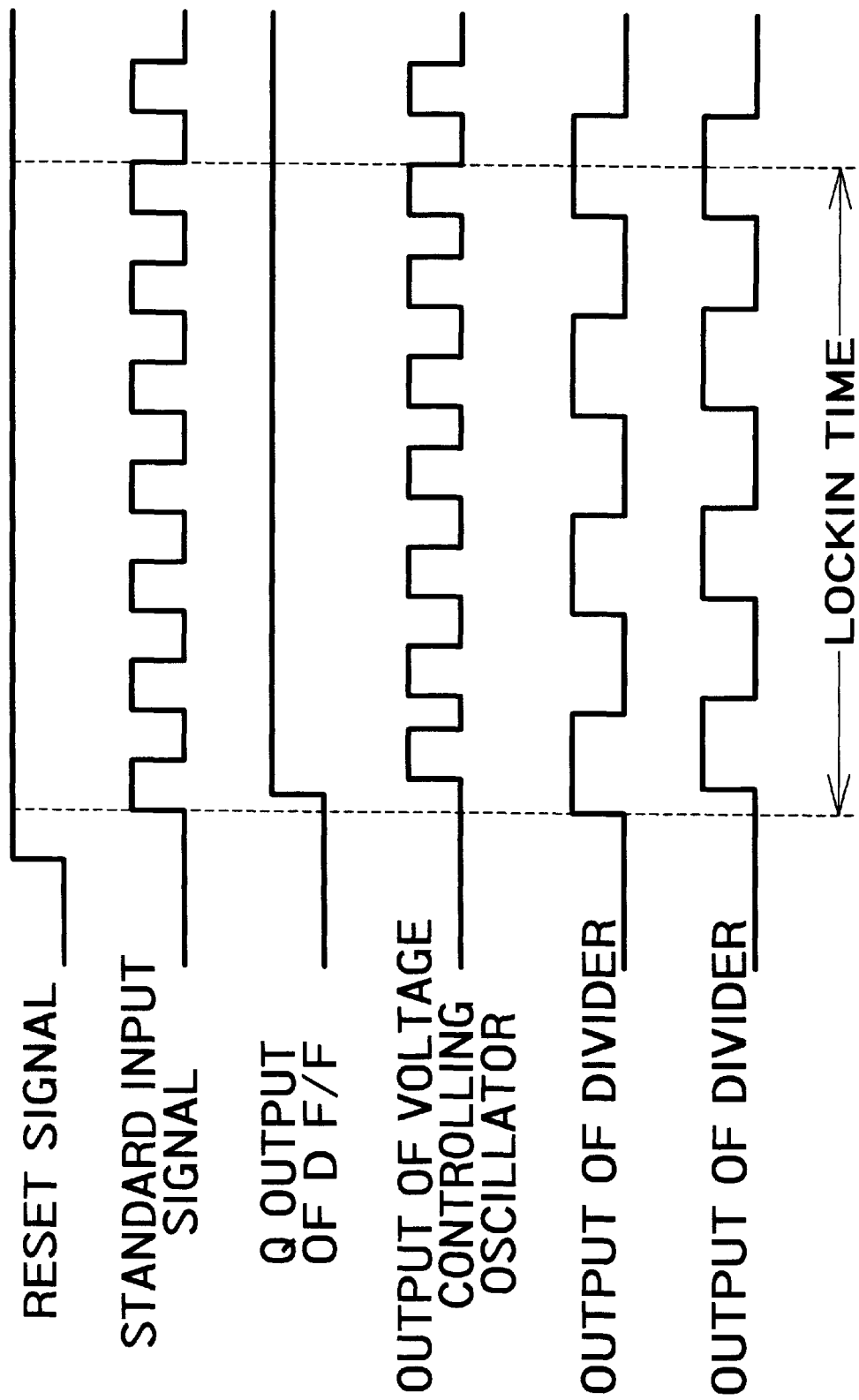
FIG. 3 is a timing diagram of the analog PLL circuit of FIG. 1.

FIG. 3 is a timing diagram of the analog PLL circuit of FIG. 1. Hereinafter, referring to FIG. 3, the operation of the circuit of FIG. 1 will be explained. The timing diagram of FIG. 3 shows an example the dividers 1 and 6 output the signal with the frequency of a second of the input signal. The dividing ratio of the dividers 1 and 6 is not limited; for example, the dividing ratio may be changed programmablely.

During the reset period, the analog switch 8 is ON state, and the initial voltage V1 is inputted to the voltage controlling oscillator 5 via the analog switch 8. As shown in FIG. 2, the initial voltage V1 is inputted to the control section 11 inside the voltage controlling oscillator 5. The control section 11 supplies the voltage corresponding to the initial voltage V1 to the transistors Q5 and Q8 in each inverter 13. Therefore, the initial delay amount of the inverter 13 is set.

Figure 4:
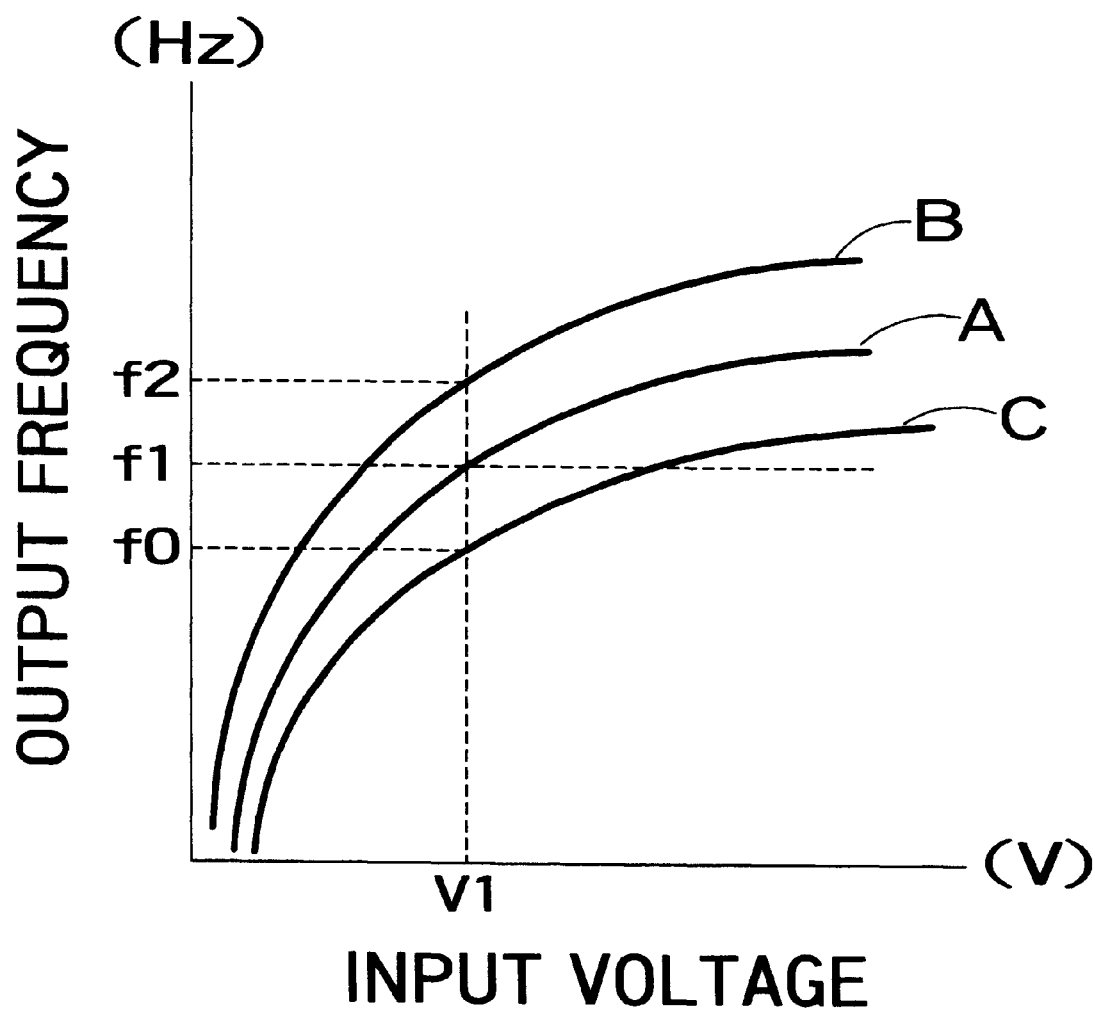
FIG. 4 is a diagram showing frequency property of the voltage controlling oscillator.

The initial voltage V1 is set in consideration of the dispersion of the frequency property of the voltage controlling oscillator 5. For example, as shown in FIG. 4, when the frequency property of the voltage controlling oscillator 5 changes due to the power supply voltage and so on, the voltage V1 corresponding to a desirable oscillating frequency f1 is detected. This voltage V1 is set as the initial voltage V1.

Therefore, the output voltage of the low pass filter 4 changes while centering the initial voltage, and the time during which the oscillating frequency and the phase settle, that is, the lockin time becomes short.

On the other hand, after the reset period finishes, at the point the rising edge of the standard input signal is inputted, the output of the D flip-flop 7 turns on. Therefore, the output of the last inverter 13 showing in FIG. 2 is fed back to input side of the first inverter 13 via the AND gate 14, and the ring oscillator 12 begins the oscillating operation.

In the first embodiment, as shown in FIG. 1 and FIG. 2, after the reset period finishes, at the point the standard input signal fin is firstly inputted, the Q output of the D flip-flop 7 turns to high level, and after the Q output with high level is inputted to AND gate 14 of the voltage controlling oscillator 5, the ring oscillator 12 begins the oscillating operation. Therefore, in case of regarding the point when the standard input signal fin rises as a standard, with delay of two stages of the D flip-flop 7 and the AND gate 14, the ring oscillator 12 begins the oscillating operation. Because the deviation of the phase is essentially small, it is possible to shorten the time it takes to allow the phase to coincide, that is, the lockin time.

Thus, the first embodiment supplies the voltage necessary to obtain the desirable oscillating frequency as the initial voltage V1 to the voltage controlling oscillator 5 during the reset period, and after the reset period finishes, at the point the rising edge of the standard input signal fin is firstly inputted, allows the voltage controlling oscillator 5 to operate. Therefore, it is possible to shorten the period during which the frequency and the phase of the voltage controlling oscillator 5 settles.

Further, because the first embodiment can be realized with a simple configuration only adding the analog switch 8 and the D flip-flop 7, it takes little cost to change the circuit design.

Figure 5:
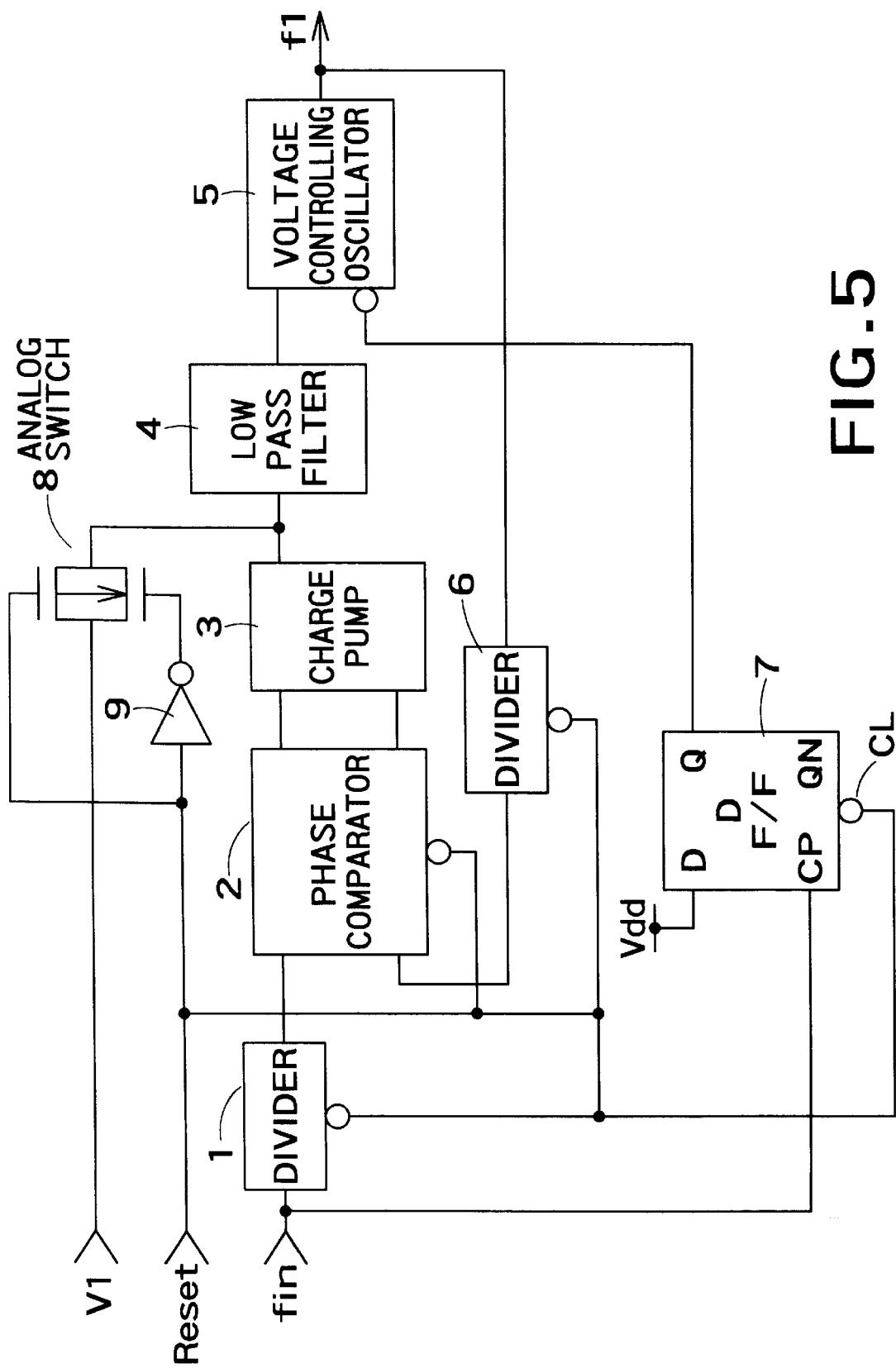
FIG. 5 is a circuit diagram showing a modified example of FIG. 1.

By the way, the analog PLL circuit of FIG. 1 connects the one terminal of the analog switch 8 to the voltage controlling oscillator 5. As shown in FIG. 5, the output terminal of the analog switch 8 may be connected to the input terminal of the low pass filter 4. Even in such a case, the same advantage as FIG. 1 is obtained, without changing the voltage level of the initial voltage V1.

In FIG. 1 and FIG. 5, the examples of the voltage controlling oscillator 5 including the ring oscillator 12 has been explained. The voltage controlling oscillator may be able to change the oscillating frequency in accordance with an external voltage; for example, the voltage controlling oscillator may have the oscillator besides the ring oscillator.

In FIG. 1 and FIG. 5, the examples of having the D flip-flop 7 have been explained. The flip-flop besides the D flip-flop may be used. In the same way, instead of the analog switch, other switches; for example, switching elements, may be used.

Second Embodiment

Instead of adjusting the delay amount of the inverter, the delay amount of the delay circuit provided between stages of the inverters may be adjusted.

Figure 6:
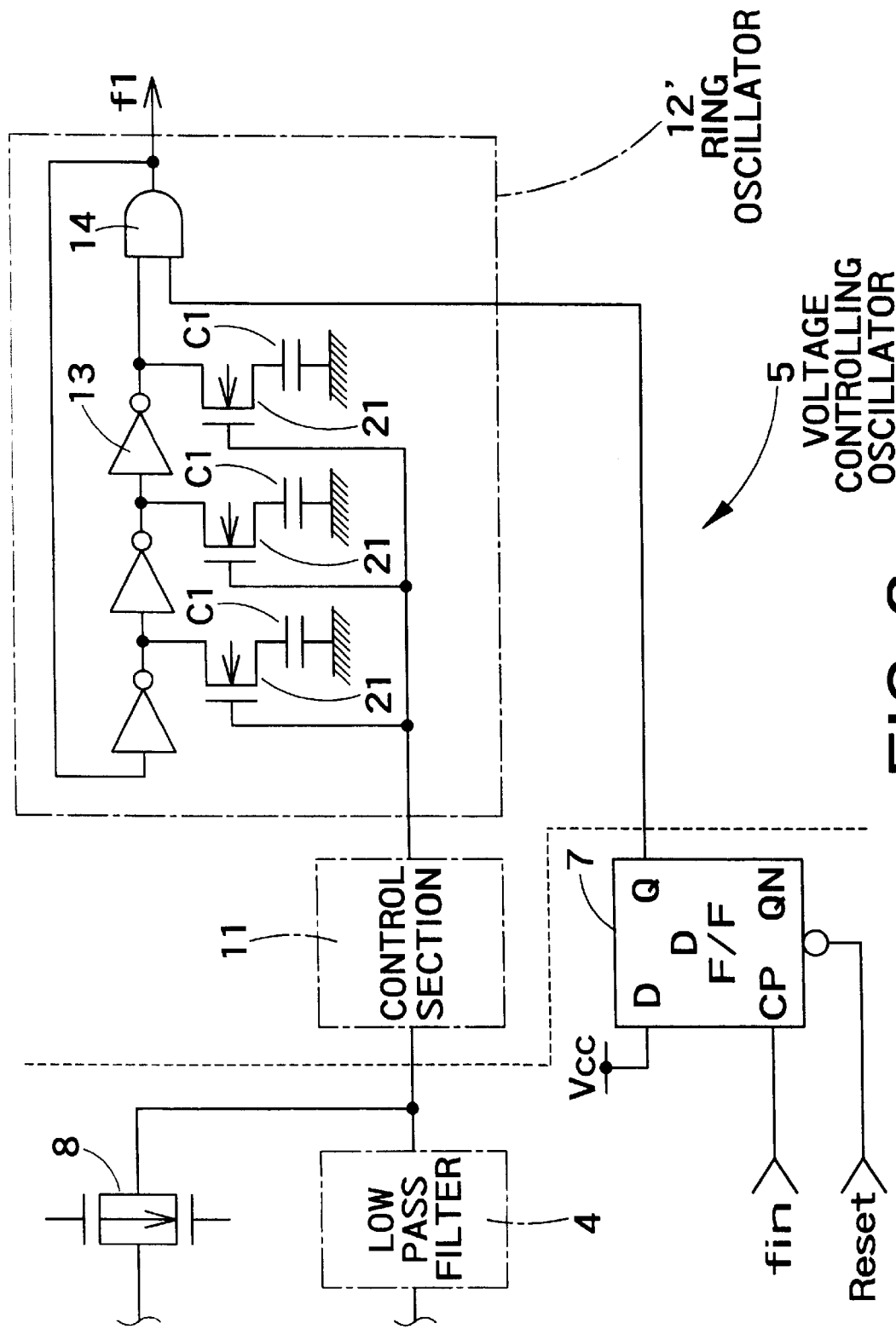
FIG. 6 is a circuit diagram of second embodiment of an analog PLL circuit according to the present invention.

FIG. 6 is a circuit diagram of the second embodiment of the analog PLL circuit according to the present invention. The analog PLL circuit of FIG. 6 has the same configuration as one of FIG. 1 and FIG. 2.

The ring oscillator 12' of FIG. 6 comprises uneven pieces of inverters 13 connected in series and NMOS transistor 21 connected between stages of each inverter 13. The drain terminal of each NMOS transistor 21 is connected to the output terminal of the respective inverter 13, and the source terminal of each NMOS transistor 21 is grounded via a capacitor C1. One terminal of the analog switch 8 is connected to the gate terminals of all the NMOS transistors 21, and the initial voltage V1 is applied to the other terminal of the analog switch 8.

During the reset period, the analog switch 8 is ON state. The initial voltage V1 is inputted to the gate terminal of each NMOS transistor 21 via the analog switch 8. By adjusting the voltage level of the initial voltage V1, it is possible to adjust the impedance of each NMOS transistor 21; consequently, it is possible to adjust the delay amount of the signal propagating each inverter 13.

Thus, each NMOS transistor 21 affects as the delay circuit capable of changing the delay amount, and the advantage similar to adjust the delay amount is obtained. That is, because the second embodiment supplies the voltage necessary to obtain the desirable oscillating frequency as the initial voltage during the reset period, it is possible to shorten the time during which the frequency and the phase of the voltage controlling oscillator 5 settle, that is, the lockin time, similar to the first embodiment.

Third Embodiment

A third embodiment is a modified example of the second embodiment.

Figure 7:
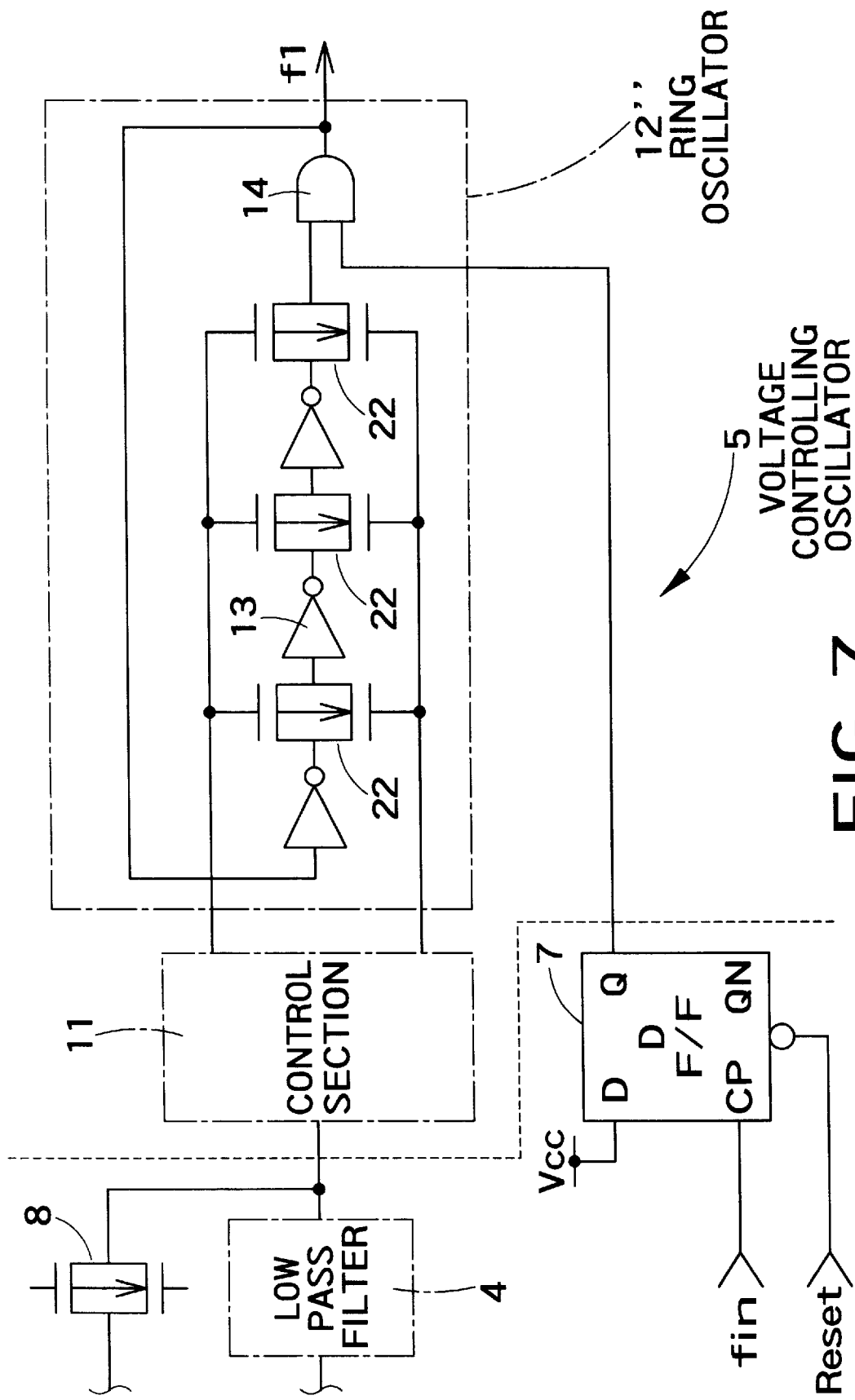
FIG. 7 is a circuit diagram of third embodiment of an analog PLL circuit according to the present invention.

FIG. 7 is a circuit diagram of the third embodiment of the analog PLL circuit according to the present invention. The analog PLL circuit of FIG. 7 comprises uneven pieces of inverters 13 connected in series and analog switches 22 connected between each stage of the inverters 13.

The resistance of each analog switch 22 is controlled by a signal from the control section 11. More specifically, the control section 11 sets the resistance of each analog switch 22 to a value corresponding to a oscillating frequency during the reset period.

Therefore, similar to the first and second embodiment, because the output of the voltage controlling oscillator 5 changes while centering a desirable frequency, it is possible to shorten the time during which the frequency and the phase of the voltage controlling oscillator 5 settle, respectively.

In the above mentioned first through three embodiment, the example comprising the analog PLL circuit formed on the semiconductor substrate have been explained. Even in the case of mounting by using the discrete elements on the semiconductor substrate, the present invention is applicable.

In the above mentioned first through three embodiment, the examples of the analog PLL circuit with the constant output frequency has been explained, by adding the circuit outputting the initial voltage V1 in accordance with the output frequency, it is possible to variably control the output frequency.

What is claimed is:

1. An analog PLL circuit, comprising:

a voltage controlling oscillator configured to change frequency in accordance with voltage;

a phase comparator configured to output a signal corresponding to a frequency deviation and a phase deviation of a signal corresponding to an output of said voltage controlling oscillator and a signal corresponding to a standard input signal;

a charge pump configured to output a voltage corresponding to an amount and a direction of the phase deviation based on the signal output by said phase comparator;

a low pass filter configured to eliminate a high-frequency component included in the voltage output by said charge pump;

a ring oscillator provided inside said voltage controlling oscillator and having a delay circuit configured to change a delay amount, an oscillating frequency of said ring oscillator being controlled variably based on said delay amount;

a delay amount control section provided inside said voltage controlling oscillator and configured to set the delay amount of said delay circuit;

an initial delay amount setting circuit configured to set an initial delay amount of said delay circuit by said delay amount control section during a reset period; and an oscillation controlling circuit configured to allow oscillating operation of said ring oscillator to begin at a point when a rising edge or a falling edge of said standard input signal is firstly inputted after the reset period finishes, said oscillating control circuit having a flip-flop with a clock terminal to which said standard input signal is inputted, and being configured to allow oscillating operation to begin at the point when the rising edge or the falling edge of said standard input signal is inputted to said clock terminal after the reset period finishes;

wherein the oscillating frequency of said voltage controlling oscillator is controlled in accordance with an output of said low pass filter.

2. An analog PLL circuit comprising:

a voltage controlling oscillator configured to change frequency in accordance with voltage;

a phase comparator configured to output a signal corresponding to a frequency deviation and a phase deviation of a signal corresponding to an output of said voltage controlling oscillator and a signal corresponding to a standard input signal;

a charge pump configured to output a voltage corresponding to an amount and a direction of the phase deviation based on the signal output by said phase comparator;

a low pass filter configured to eliminate a high-frequency component included in the voltage output by said charge pump;

a ring oscillator provided inside said voltage controlling oscillator and having uneven pieces of logic inverting elements configured to change a delay amount, an output of a last stage of said logic inverting elements being fed back to an input of a first stage of said logic inverting elements, and an oscillating frequency of said ring oscillator being controlled variably in accordance with the delay amount;

a delay amount control section provided inside said voltage controlling oscillator and configured to set the delay amount of said logic inverting elements;

an initial delay amount setting circuit configured to set an initial delay amount of said logic inverting elements by said delay amount control section during a reset period; and an oscillation controlling circuit configured to allow oscillating operation of said ring oscillator to begin at a point when a rising edge or a falling edge of said standard input signal is firstly inputted after the reset period finishes, said oscillating control circuit having a flip-flop with a clock terminal to which said standard input signal is inputted, and being configured to allow oscillating operation to begin at the point when the rising edge or the falling edge of said standard input signal is inputted to said clock terminal after the reset period finishes.

3. An analog PLL circuit comprising:

a voltage controlling oscillator configured to change frequency in accordance with voltage;

a phase comparator configured to output a signal corresponding to a frequency deviation and a phase deviation of a signal corresponding to an output of said voltage controlling oscillator and a signal corresponding to a standard input signal;

a charge pump configured to output a voltage corresponding to an amount and a direction of the phase deviation based on the signal output by said phase comparator;

a low pass filter configured to eliminate a high-frequency component included in the voltage output by said charge pump;

a ring oscillator provided inside said voltage controlling oscillator, and having uneven pieces of logic inverting elements connected in series and delay circuits connected between each stage of said logic inverting elements configured to change a delay amount, an oscillating frequency of said ring oscillator being controlled variably in accordance with the delay amount;

a delay amount control section provided inside said voltage controlling oscillator and configured to set the delay amount of said delay circuits;

an initial delay amount setting circuit configured to set an initial delay amount of said delay circuits by said delay amount control section during a reset period; and an oscillation controlling circuit configured to allow oscillating operation of said ring oscillator to begin at a point when a rising edge or a falling edge of said standard input signal is firstly inputted after the reset period finishes, said oscillating control circuit having a flip-flop with a clock terminal to which said standard input signal is inputted, and being configured to allow oscillating operation to begin at the point when the rising edge or the falling edge of said standard input signal is inputted to said clock terminal after the reset period finishes.

4. The analog PLL circuit according to claim 1, wherein:

said initial delay amount setting circuit sets the delay amount corresponding to a desirable oscillating frequency as an initial delay amount, based on a frequency property near the center of dispersive range of the frequency property of said voltage controlling oscillator.

5. The analog PLL circuit according to claim 2, wherein:

said initial delay amount setting circuit sets the delay amount corresponding to a desirable oscillating frequency as an initial delay amount, based on a frequency property near the center of dispersive range of the frequency property of said voltage controlling oscillator.

6. The analog PLL circuit according to claim 3, wherein:

said initial delay amount setting circuit sets the delay amount corresponding to a desirable oscillating frequency as an initial delay amount, based on a frequency property near the center of dispersive range of the frequency property of said voltage controlling oscillator.

7. The analog PLL circuit according to claim 1, wherein:

said initial delay amount setting circuit has an analog switch configured to supply a signal with a prescribed voltage level to said delay amount control section only during the reset period; and said delay amount control section controls the delay amount of said delay circuit in accordance with the signal of said analog switch during the reset period and in accordance with the output of said low pass filter after the reset period finishes.

8. The analog PLL circuit according to claim 2, wherein:

said initial delay amount setting circuit has an analog switch configured to supply a signal with a prescribed voltage level to said delay amount control section only during the reset period; and said delay amount control section controls the delay amount of each of said logic inverting elements in accordance with the signal of said analog switch during the reset period and in accordance with an output of said low pass filter after the reset period finishes.

9. The analog PLL circuit according to claim 3, wherein:

said initial delay amount setting circuit has an analog switch configured to supply a signal with a prescribed voltage level to said delay amount control section only during the reset period; and said delay amount control section controls the delay amount of each of said logic inverting elements in accordance with the signal of said analog switch during the reset period and in accordance with an output of said low pass filter after the reset period finishes.

10. The analog PLL circuit according to claim 2, wherein:

each of said logic inverting elements in said ring oscillator comprises a MOS transistor, an impedance between a drain and a source terminals of each MOS transistor being changed in accordance with an output voltage of said delay amount control section; and said delay amount control section allows the delay amount to change by adjusting the impedance between the drain and the source terminals of each MOS transistor.

11. The analog PLL circuit according to claim 3, wherein:

each of said logic inverting elements in said ring oscillator comprises a MOS transistor, an impedance between a drain and a source terminals of each MOS transistor being changed in accordance with an output voltage of said delay amount control section; and said delay amount control section allows the delay amount to change by adjusting the impedance between the drain and the source terminals of each MOS transistor.

12. The analog PLL circuit according to claim 2, wherein:

said ring oscillator has a logic element connected to the output terminal of the last stage of said logic inverting elements, the output logic of said logic element changing in accordance with the output of the last stage of said logic inverting elements and the output of said flip-flop, and the output of said logic element being fed back to input side of the first stage of said logic inverting elements.

13. The analog PLL circuit according to claim 3, wherein:

said ring oscillator has a logic element connected to the output terminal of the last stage of said logic inverting elements, the output logic of said logic element changing in accordance with the output of the last stage of said logic inverting elements and the output of said flip-flop, and the output of said logic element being fed back to input side of the first stage of said logic inverting elements.

14. A method of controlling the oscillation of a voltage control oscillator comprising a ring oscillator having odd pieces of logic inverting elements configured to change a delay amount, said logic inverting elements being connected in series, and a delay amount control section configured to set the delay amount of each of said logic inverting elements, comprising the steps of:

setting an initial delay amount of each of said logic inverting elements by said delay amount control section during a reset period; and allowing oscillating operation of said ring oscillator to begin, after the reset period finishes; and after a rising edge or a falling edge of a standard input signal is inputted to a clock terminal of a flip-flop, at a point when an output logic of the flip-flop has changed.

15. The method of controlling the oscillation of a voltage control oscillator according to claim 14, wherein:

said voltage control oscillator is provided in an analog PLL circuit comprising a phase comparator configured to compare the standard input signal with an output signal of said voltage control oscillator, a charge pump configured to output a signal corresponding to an output signal of said phase comparator, and a low pass filter configured to eliminate noise included in the signal output by said charge pump; and said step for allowing the oscillating operation of said ring oscillator to begin sets the delay amount of said delay amount control section based on an output of said low pass filter.

* * * * *

UNITED STATES PATENT AND TRADEMARK OFFICE
CERTIFICATE OF CORRECTION

PATENT NO.    : 6,114,917
DATED         : September 5, 2000
INVENTOR(S)   : Shoji NAKAJIMA, et al.

It is certified that error appears in the above-identified patent and that said Letters Patent is hereby corrected as shown below:

On the Title page, in Item [75] the 1st Inventor's Name is incorrect. Item [75] should read as follows:

[75] Inventors: Shoji Nakajima, Tokyo; Tamami Hatanaka, Kawasaki; Moriyuki Tashiro, Tokyo; Minoru Kiumi, Yokohama; Hiroshisa Hirano, Kawasake, all of Japan Signed and Sealed this Fifth Day of June, 2001

*Attest:*

*Attesting Officer*

NICHOLAS P. GODICI

*Acting Director of the United States Patent and Trademark Office*